United States Patent
Liu et al.

(10) Patent No.: US 11,997,820 B2
(45) Date of Patent: May 28, 2024

(54) CAGE ASSEMBLY AND ELECTRONIC DEVICE INCLUDING THE SAME

(71) Applicant: WISTRON CORP., New Taipei (TW)

(72) Inventors: Zih-Yao Liu, New Taipei (TW); Shin-Yi Hsieh, New Taipei (TW)

(73) Assignee: WISTRON CORP., New Taipei (TW)

( * ) Notice: Subject to any disclaimer, the term of this patent is extended or adjusted under 35 U.S.C. 154(b) by 35 days.

(21) Appl. No.: 17/819,104

(22) Filed: Aug. 11, 2022

(65) Prior Publication Data
US 2023/0309254 A1    Sep. 28, 2023

(30) Foreign Application Priority Data

Mar. 25, 2022   (TW) .................................. 111111451

(51) Int. Cl.
*H05K 7/14*   (2006.01)

(52) U.S. Cl.
CPC ......... *H05K 7/1488* (2013.01); *H05K 7/1427* (2013.01)

(58) Field of Classification Search
CPC .. H05K 7/1488; H05K 7/1427; H05K 5/0221; H05K 7/14; H05K 7/1411; H05K 7/1424; H05K 7/1452; H05K 7/1461; H05K 7/1487; H05K 7/1489; H05K 7/1492; H05K 7/20172; G06F 1/184; G06F 1/185; G06F 1/186; G06F 1/187; G06F 1/188; G06F 1/20
See application file for complete search history.

(56) References Cited

U.S. PATENT DOCUMENTS

| | | | |
|---|---|---|---|
| 6,190,197 B1 | 2/2001 | Polgar et al. | |
| 6,808,411 B2 * | 10/2004 | Chen | H05K 7/20172 439/246 |
| 7,641,441 B2 * | 1/2010 | Chuang | F04D 29/582 415/214.1 |
| 8,405,988 B2 * | 3/2013 | Wang | H05K 7/20172 361/695 |
| 8,807,934 B2 * | 8/2014 | Tsai | F03D 80/00 415/213.1 |
| 10,058,003 B1 * | 8/2018 | Wang | H05K 5/0278 |
| 10,486,276 B2 | 11/2019 | Shiu et al. | |
| 2015/0264843 A1 * | 9/2015 | Alshinnawi | H05K 5/0026 174/379 |

FOREIGN PATENT DOCUMENTS

| | | |
|---|---|---|
| CN | 1191661 C | 3/2005 |
| CN | 207363932 U | 5/2018 |
| TW | M557964 U | 4/2018 |

OTHER PUBLICATIONS

TW Office Action dated Oct. 18, 2022 in Taiwan application No. 111111451.
TW Office Action dated Jan. 10, 2024 in Taiwan application No. 111111451.

* cited by examiner

*Primary Examiner* — James Wu
*Assistant Examiner* — Christopher L Augustin
(74) *Attorney, Agent, or Firm* — McClure, Qualey & Rodack, LLP (57) ABSTRACT

A cage assembly includes a cage body and an adjustable component, where the adjustable component is movably disposed on the cage body, the adjustable component has a connector-installing portion, and a position of the connector-installing portion is changed along with the adjustable component.

20 Claims, 9 Drawing Sheets

CAGE ASSEMBLY AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 111111451 filed in R.O.C. (Taiwan) on Mar. 25, 2022, the entire contents of which are hereby incorporated by reference.

TECHNICAL FIELD

The disclosure relates to a cage assembly, more particularly relates to a cage assembly including an adjustable component and an electronic device including the same.

BACKGROUND

With the rapid development of technologies related to cloud services, the market demand for servers is increasing.

A server rack unit, or U, is a unit of measurement used to describe the amount of equipment space a server rack has, which provides a standard for user to arrange servers in limited room space. A U is 1.75 inches or 44.45 mm high. For example, an 8 U rack has 8 units of vertical server rack space. Server racks of 1 U, 2 U, 3 U ... 6 U, 8 U and higher are common in the market.

With the improvement of the performance of various components in the server, the rack must be equipped with a heat dissipation system. For example, a fan can be placed in the rack to produce airflow to discharge the waste heat to the outside. When the rack is higher than, for example, 4 U, it may adopt an array of fans to make sure that different areas in the rack will receive require amount of cooling air. In this case, a plurality of fans are accommodated in a fan rack and electrically connected to connectors on a circuit board.

To match the connectors on the circuit board with the connectors of the fans accommodated in the fan rack, these mating connectors shall have corresponding positions and at the same height. However, conventionally, the position of the fan connector is fixed, thus the fan connector may not be suitable for the connector on a circuit board applied to racks of different heights; that is, the conventional fan may only be suitable for applied to one specific rack configuration. As a result, it needs to redesign or develop new fan according to the difference in rack, thereby increasing cost.

SUMMARY

Accordingly, one aspect of the disclosure is to provide a cage assembly and an electronic device including the same which are applicable to racks of different sizes.

One embodiment of the disclosure provides a cage assembly including a cage body and an adjustable component, where the adjustable component is movably disposed on the cage body, the adjustable component has a connector-installing portion, and a position of the connector-installing portion is changed along with the adjustable component.

One embodiment of the disclosure provides an electronic device including a chassis and a cage assembly, the cage assembly is disposed on the chassis and includes a cage body and an adjustable component. The adjustable component is movably disposed on the cage body. The adjustable component has a connector-installing portion, and a position of the connector-installing portion is changed along with the adjustable component.

One embodiment of the disclosure provides an electronic device adapted to accommodate an electrical component and including a chassis, a circuit board, and a cage assembly. The circuit board is disposed on the chassis. The cage assembly includes a cage body and an adjustable component. The cage body is removably accommodated in the chassis and configured to accommodate the electrical component. The adjustable component is movably disposed on the cage body and has a first position and a second position. The adjustable component has a connector-installing portion, and a position of the connector-installing portion is changed along with the adjustable component switched between the first position and the second position. The circuit board has a positioning post selectively fitting to the adjustable component when the adjustable component is in the first position.

According to the cage assembly and the electronic device as discussed in the above embodiments of the disclosure, the adjustable component of the cage assembly is movable relative to the cage body to change the position of the connector-installing portion, which allows the connector-installing portion to match the position of an electrical connector that the cage assembly is attempted to connect.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the terms "mounted," "connected," and variations thereof are used broadly and encompass both direct and indirect mountings and connections. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities.

Figure 1:
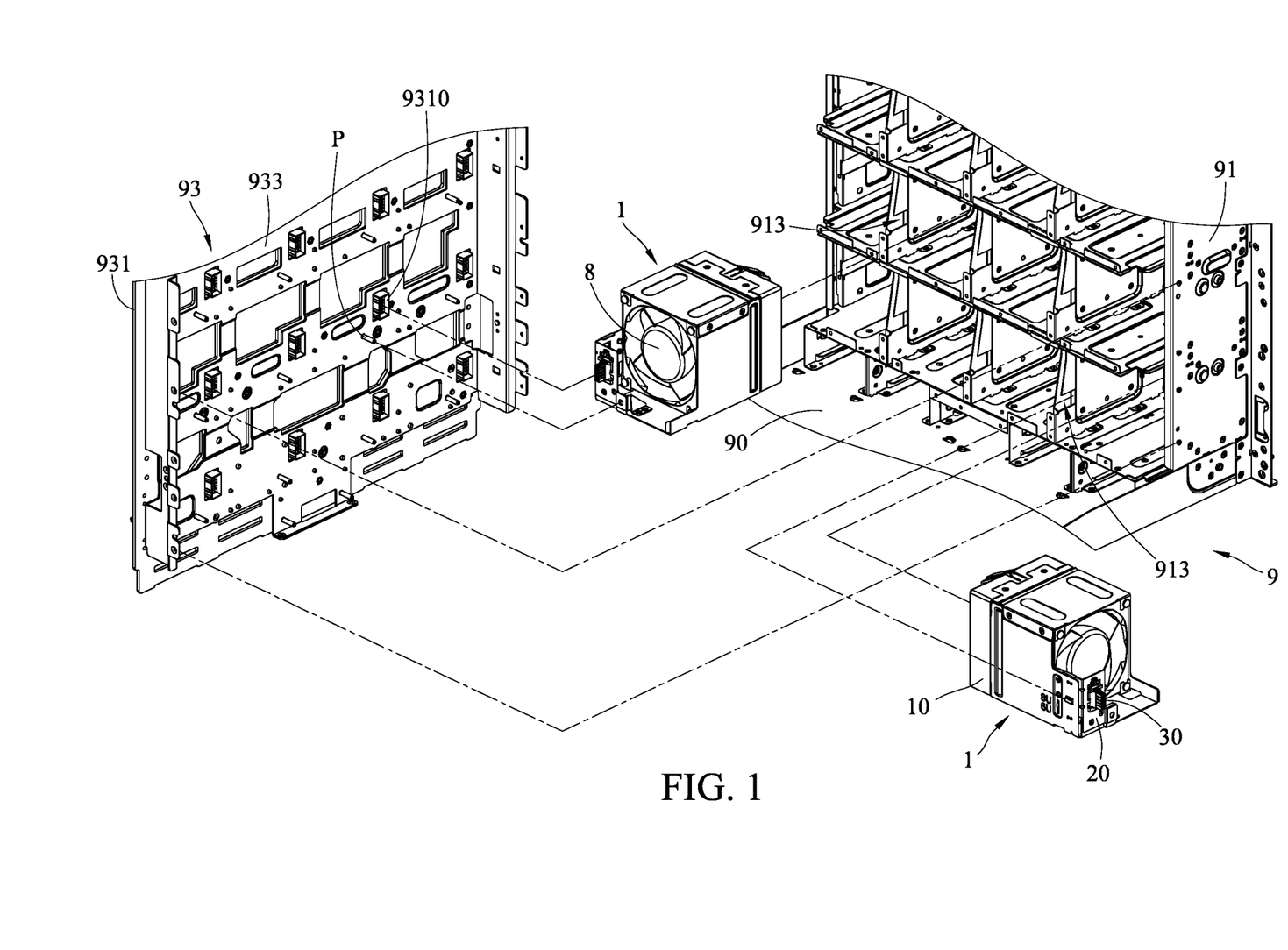
FIG. 1 is an exploded perspective view of an electronic device including at least one cage assembly according to one embodiment of the disclosure.
Figure 2:
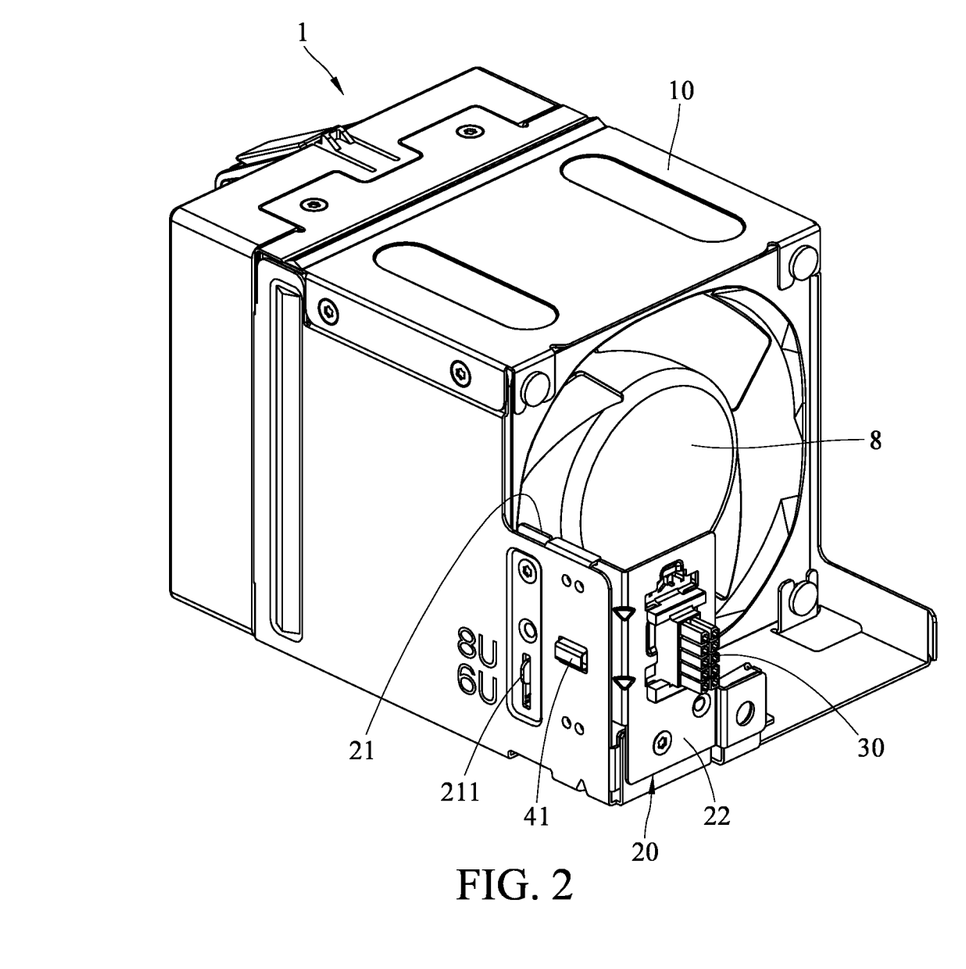
FIG. 2 is a perspective view of the cage assembly in FIG. 1.
Figure 3:
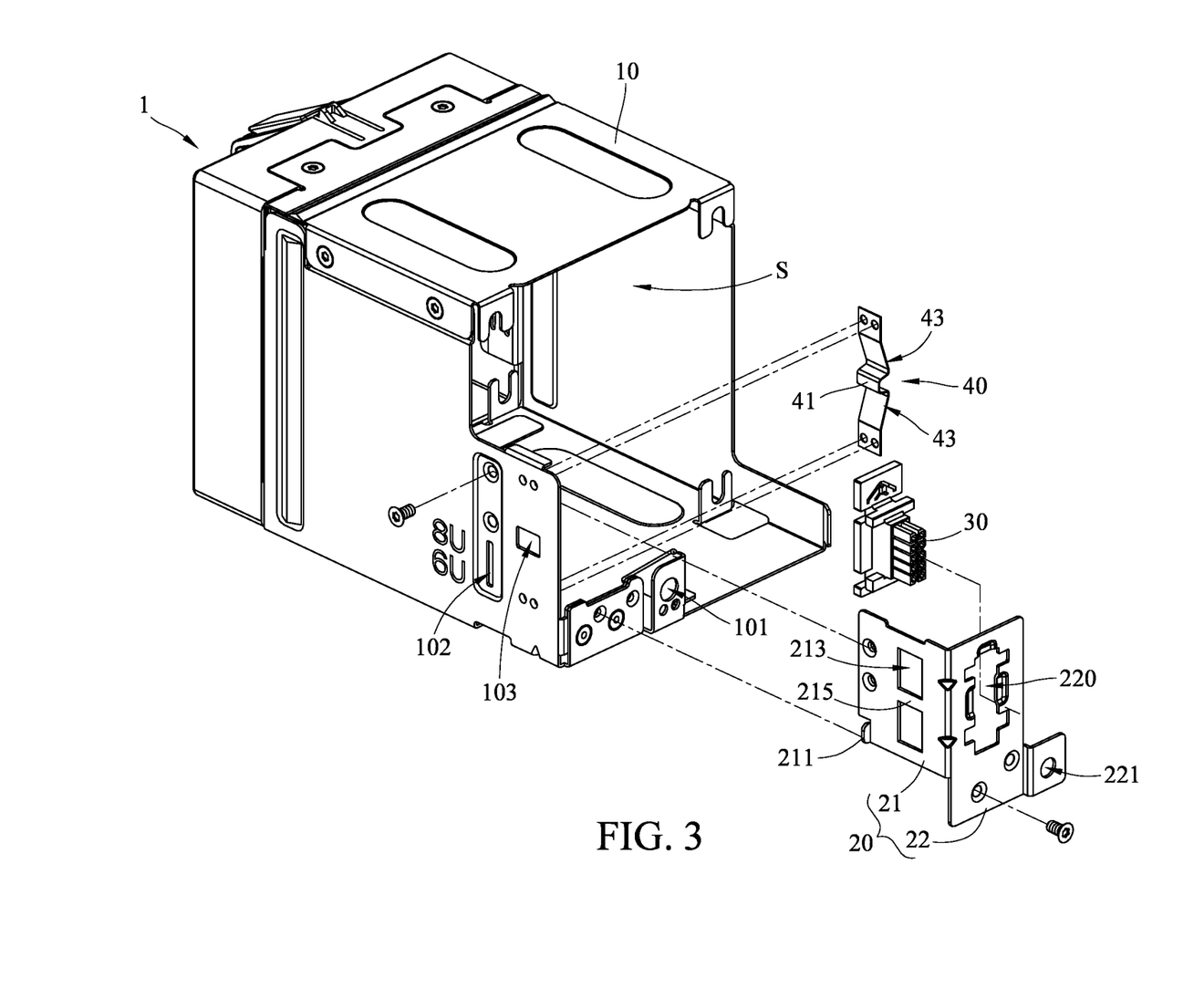
FIG. 3 is an exploded view of the cage assembly in FIG. 2.

Firstly, referring to FIGS. 1-3, one embodiment of the disclosure provides an electronic device 9. The electronic device 9 may be, but is not limited to, a desktop computer, a server, or part of any one thereof, but the disclosure is not limited thereto. The electronic device 9 may include a chassis 90. The chassis 90 may accommodate or support a rack 91. The rack 91 may be, but is not limited to, a 6 U or 8 U server rack. Note that the rack 91 is provided for better understanding the disclosure but is not intended to limit the disclosure. The rack 91 is configured to accommodate one cage assembly 1 or an array of cage assemblies 1. The cage assembly 1 is configured to be removably accommodated within the rack 91. Note that the number and array of the cage assemblies 1 that can be accommodated in the rack 91 are exemplary and not limiting. The cage assembly 1 is configured to accommodate an electrical component 8. The electrical component 8 may be a fan. Note that the electrical component 8 is provided for better understanding the disclosure but not limiting. By an array of the cage assemblies 1, a plurality of the electrical components 8 may be arranged in an array on the rack 91 to produce the required cooling air to the chassis 90.

In addition, as shown, the chassis 90 may have a circuit board assembly 93 thereon. The circuit board assembly 93 may vertically stand on the chassis 90 and arranged at a side of the rack 91. The circuit board assembly 93 may have a size matching the height of the rack 91 and is suitable for being installed on the rack 91, thus the circuit board assembly 93 may be arranged between the rack 91 and other modules in the chassis 90 (not shown, for example, hard drives or display modules). The circuit board assembly 93 may include a circuit board 931 and a metal frame 933. The circuit board 931 may be a midplane board and vertically disposed in the chassis 90. There may be one or more electrical connectors 9310 arranged on a side of the circuit board 931 facing towards the rack 91. The number and arrangement of the electrical connectors 9310 may match that of the cage assemblies 1 on the rack 91, thus the electrical connectors 9310 are able to be respectively electrically connected to the electrical components 8 on the cage assemblies 1. It is noted that the number of the electrical connector on the circuit board and the number of the cage assembly on the rack may be changed according to actual requirements; in some other embodiments, there may be only one electrical connector on the circuit board that is needed to be connected to the cage assembly on the rack.

Optionally, there may be one or more positioning posts P disposed on the side of the circuit board assembly 93 facing towards the rack 91; in specific, the positioning posts P protrude from the side of the metal frame 933 facing towards the rack 91 and therefore are arranged at the side of the circuit board 931 facing towards the rack 91. The number and arrangement of the positioning posts P may match that of the cage assemblies 1 on the rack 91, thus the positioning posts P are able to position the cage assembly 1, respectively. Note that the status of the cage assembly 1 can be changed to make it fit the positions of the positioning posts P or fit a circuit board 931 without any positioning post P thereon. It is also noted that the number of the positioning post on the circuit board assembly may be changed according to actual requirements; in some other embodiments, there may be only one positioning post on the circuit board assembly for the single cage assembly on the rack.

Taking one of the cage assemblies 1 as an example for detail descriptions, in this embodiment, the cage assembly 1 may include a cage body 10, an adjustable component 20, and an electrical connector 30. The cage body 10 is configured to accommodate or support the electrical component 8. The cage body 10 may be integrally formed of a single piece or may be an assembly of a plurality of pieces. As shown, the cage body 10 may be a box or a container with two openings at two opposite sides and therefore defines an accommodation space S capable of accommodating the electrical component 8. Note that there may be one or more fasteners, such as bolts or screws, on the cage body 10 for fixing the electrical component 8.

Figure 4A:
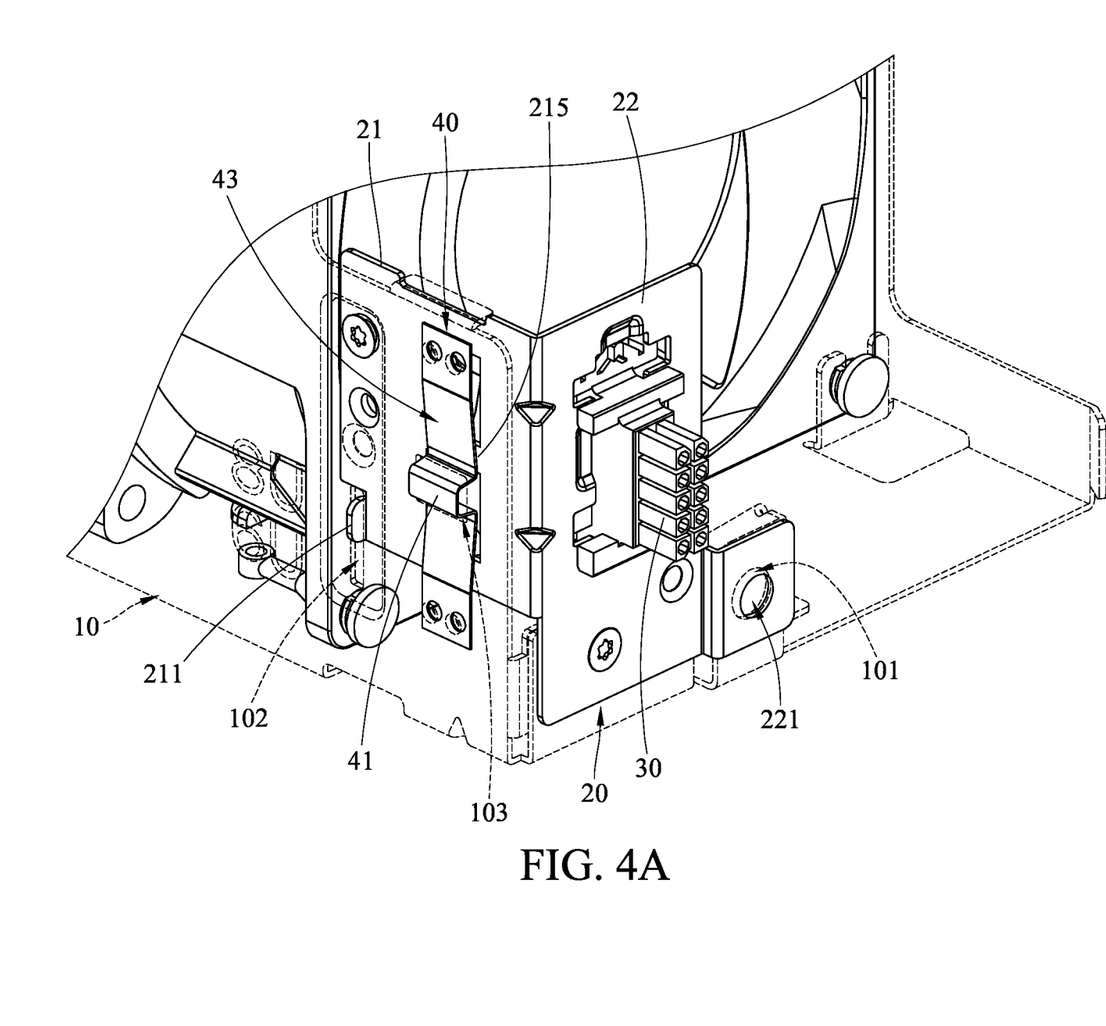
FIGS. 4A-4B depict the operation of the cage assembly in FIG. 2.
Figure 4B:
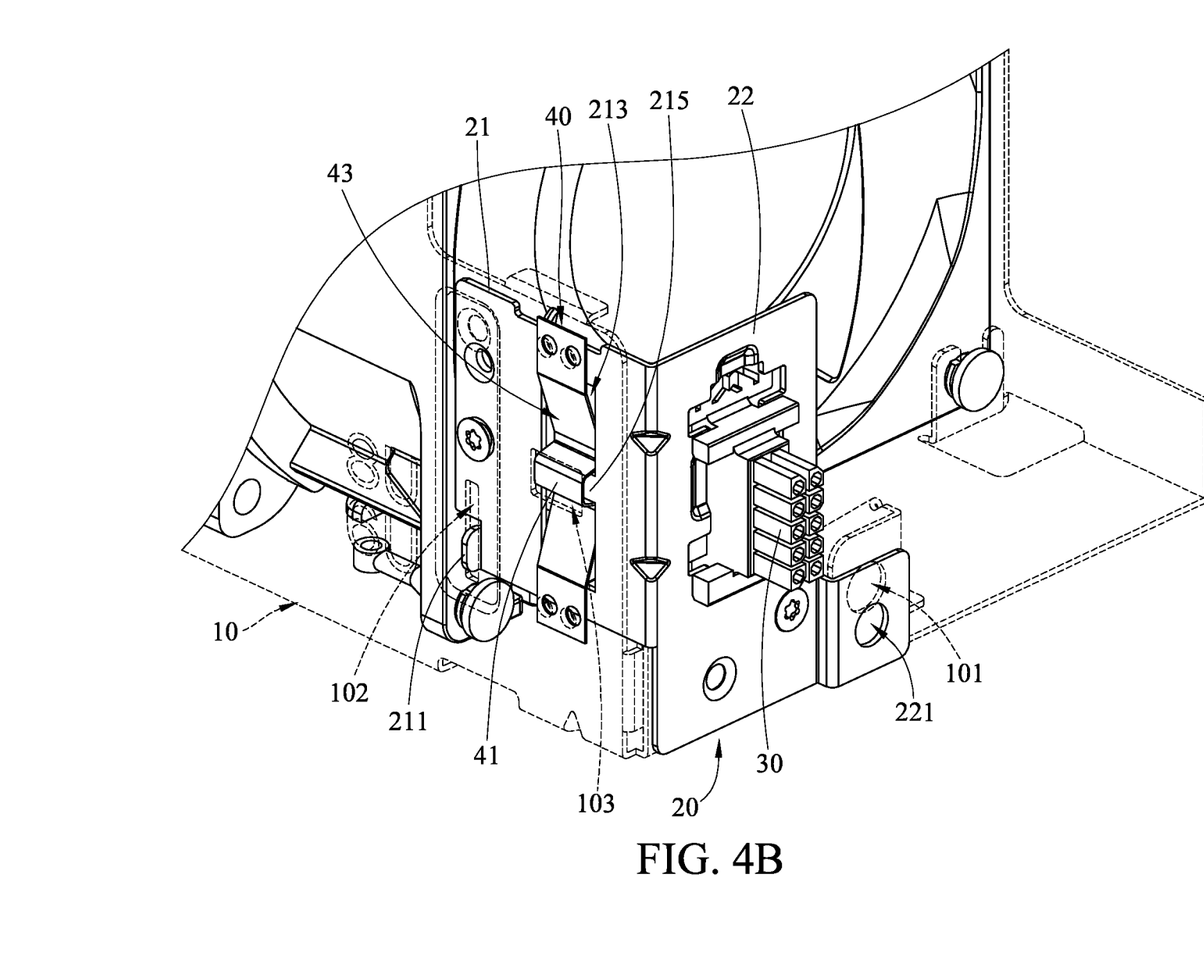

The adjustable component 20 is movably disposed on the cage body 10. The adjustable component 20 is configured for the installation of an electrical connector 30; in other words, the electrical connector 30 is movably disposed on the cage body 10 via the adjustable component 20. Herein, the adjustable component 20 is switchable between a first position (as shown in FIGS. 1-2 and FIG. 4A) and a second position (as shown in FIG. 4B).

The electrical connector 30 is configured to be electrically connected to the electrical component 8 and the electrical connector 9310 on the circuit board assembly 93. In one embodiment, the electrical connector 9310 and the electrical component 8 may be electrically connected to each other by a wired manner. In specific, the electrical connector 30 is configured for connecting to a cable (not shown) coming from the electrical component 8, and the electrical connector 30 is also configured for connecting to the electrical connectors 9310 on the circuit board assembly 93; in other words, the circuit board assembly 93 may be electrically connected to the electrical component 8 via the electrical connector 9310 and the electrical connector 30. Note that the electrical connectors 30 and 9310 are provided for better understanding the disclosure but not limiting.

In this embodiment, the adjustable component 20 may include a first plate portion 21 and a second plate portion 22 connected to each other. The first plate portion 21 is at an angle (e.g., 90 degrees) to the second plate portion 22. The first plate portion 21 and the second plate portion 22 are respectively located at different sides of the cage body 10. The electrical connector 30 is disposed at the second plate portion 22; in other words, the electrical connector 30 and the first plate portion 21 are respectively located at different sides of the cage body 10.

In this embodiment, the cage body 10 may have a first through hole 101 in fluid communication with the accommodation space S, the second plate portion 22 of the adjustable component 20 may have a connector-installing portion 220 and a second through hole 221. The connector-installing portion 220 is configured for the installation of the electrical connector 30. In one example, the connector-installing portion 220 may be a through hole for the electrical connector 30 to be fixed on the adjustable component 20. When the adjustable component 20 is in the first position, the second through hole 221 is aligned with the first through hole 101 of the cage body 10; in other words, when adjustable component 20 is in the first position, the first through hole 101 and the second through hole 221 of the adjustable component 20 may expose the accommodation space S of the cage body 10.

Optionally, in this embodiment, the cage body 10 may further have a slot 102, the adjustable component 20 may have a tab 211 protruding outwards from the first plate portion 21. The tab 211 is slidably located in the slot 102. The tab 211 may be exposed by the slot 102, allowing user to see what position the adjustable component 20 is currently in.

Optionally, the cage assembly 1 may further include a latch 40, the cage body 10 may further have a latching hole 103, and there may be two accommodating holes 213 and a push portion 215 arranged on the surface of the first plate portion 21 of the adjustable component 20, where the push portion 215 is connected between the accommodating holes 213. In detail, the latch 40 is elastic and may include a convex portion 41 and two elastic arm portions 43, and the convex portion 41 is connected between the elastic arm portions 43. Thus, the convex portion 41 is movably disposed on the cage body 10 and corresponding to the latching hole 103 via the elastic arm portions 43. At least part of each elastic arm portion 43 is located at or disposed through the accommodating hole 213 on the first plate portion 21 of the adjustable component 20; in other words, the accommodating hole 213 on the first plate portion 21 of the adjustable component 20 is able to accommodate at least part of the respective elastic arm portion 43. During the position switching of the adjustable component between the first position and the second position, the push portion 215 between the accommodating holes 213 may push the elastic arm portions 43 located at the accommodating holes 213 so as to force the convex portion 41 to protrude outwards from the latching hole 103. During the position switching of the adjustable component 20 between the first position and the second position, the push portion 215 may be moved to behind the convex portion 41 and therefore reach a position not causing the convex portion 41 to move relative to the latching hole 103; in specific, when the adjustable component 20 is in the second position, the push portion may be located at the convex portion and does not cause the convex portion 41 to move. Thus, the elastic arm portions 43 are respectively partially located in the accommodating holes 213 so that the convex portion 41 is submerged in the latching hole 103; that is, the elastic arm portions 43 are able to keep the convex portion 41 not sticking out of the latching hole 103 of the cage body 10.

Please refer to FIG. 1 and further refer to FIG. 4A, when the cage assembly 1 is needed to be installed into a rack 91 of 8 U, the user can switch the adjustable component 20 to the first position so as to move the electrical connector 30 to a position corresponding to the position (e.g., height) of the electrical connector 9310 on the circuit board 931. By doing so, the push portion 215 on the first plate portion 21 of the adjustable component 20 will push the elastic arm portion 43 in the accommodating hole 213 so as to force the convex portion 41 to protrude from the latching hole 103; as a result, the adjustable component 20 is fixed in the first position by the convex portion 41 penetrating through the latching hole 103. Meanwhile, the second through hole 221 of the adjustable component 20 will be aligned with the first through hole 101 of the cage body 10. Optionally, the first plate portion 21 and the second plate portion 22 of the adjustable component 20 may be fixed to the cage body 10 using additional fasteners, such as bolts or screws when the adjustable component 20 is in the first position.

Then, the cage assembly 1 can be placed at the predetermined position on the rack 91. In specific, the rack 91 may have a plurality of guide slots 913 (as shown in FIG. 1) for receiving the convex portion 41 protruding from the latching hole 103 of the cage body 10 and thus preventing having interference with the cage assembly 1 during the placement into the rack 91.

Then, the circuit board assembly 93 can be installed on the rack 91. During this process, the second through hole 221 of the adjustable component 20 in the first position is aligned with the first through hole 101 of the cage body 10, thus the positioning post P on the circuit board assembly 93 can penetrate through the second through hole 221 and the first through hole 101, allowing the electrical connector 30 of the cage assembly 1 to electrically connect the electrical connector 9310 of the circuit board assembly 93 and thereby finishing the installation of the electrical component 8 and the circuit board assembly 93 to the chassis 90.

When the cage assembly 1 is needed to be installed into a rack (not shown) of 6 U, it requires a circuit board that has a configuration fitting the rack of 6 U. The positions (e.g., heights) of the electrical connectors on the circuit board may be different from that of the electrical connectors on the circuit board, thus, the adjustable component 20 of the cage assembly 1 can be switched to the second position to make the electrical connectors 30 thereon to align with the electrical connectors on the circuit board and thereby facilitating the installation of the electrical component 8 and the circuit board assembly to the rack of 6 U.

Please refer to FIG. 4B, as shown, when the adjustable component 20 is switched to the second position from the first position to move the electrical connector 30 downwards, the second through hole 221 of the adjustable component 20 is displaced from the first through hole 101 of the cage body 10, and the push portion 215 on the first plate portion 21 of the adjustable component 20 is moved to behind the convex portion 41 so that the elastic arm portions 43 retract the convex portion 41 back into the latching hole 103. Optionally, the first plate portion 21 and the second plate portion 22 of the adjustable component 20 may be fixed to the cage body 10 using additional fasteners, such as bolts or screws when the adjustable component 20 is in the second position.

Then, similar to the aforementioned steps, when the cage assembly 1 is placed into the rack, the position of the electrical connector 30 (e.g., the height) can be aligned with the electrical connector on the circuit board since the adjustable component 20 is switched to the second position. Also, in this case, the convex portion 41 does not stick out the cage body 10 from the latching hole 103, thus the rack for receiving the cage assembly 1 may omit the aforementioned guide slots 913. And since the second through hole 221 of the adjustable component 20 is not aligned with the first through hole 101 of the cage body 10, thus the circuit board assembly applied to this case may omit the aforementioned positioning post P (that is, the adjustable component 20 may be adopted to a circuit board without the positioning post.

As discussed in the aforementioned cases, since the position of the electrical connector 30 is switchable by the adjustable component 20, the cage assembly 1 with the electrical component 8 is able to be adopted to racks of different heights (6 U or 8 U) and to circuit boards with electrical connectors in different positions; in short, the cage assembly 1 with the adjustable component 20 makes it possible to fit the electrical component 8 thereon to mating connectors at different height.

In addition, the cage assembly 1 having the adjustable component 20 enables a foolproof design when applied to chassis with racks of different height. In specific, when the cage assembly 1 is to be installed into a 8 U rack and the adjustable component 20 is still in the second position, the first through hole 101 is not aligned with the second through hole 221 so that the positioning post P on the circuit board assembly 93 will be blocked by the cage body 10 during the placement of the cage assembly 1 into the rack 91, letting the user to aware that the installation step is wrong; on the other hands, when the cage assembly 1 is installed into a rack of 6 U and the adjustable component 20 is in the first position, the convex portion 41 that protrudes out of the cage body 10 from the latching hole 103 will have interference with the rack without guide slots 913 and therefore lets user to aware that the installation step is wrong during the placement of the cage assembly 1 into the rack.

Note that the aforementioned cage assembly 1 is exemplary but not limiting. Any required modification based on the aforementioned basic arrangement as discussed above may be applied to the cage assembly. The following paragraphs will introduce cage assemblies of other embodiments of the disclosure that also are able to achieve the similar function done by the previous embodiment. For the simplicity, only the main differences between the previous and following embodiments will be described in detail, and the similar or the same parts thereof can be comprehended with reference to the previous paragraphs and therefore is not repeated hereinafter. Also, the same reference number denote to the same component or element.

Figure 5:
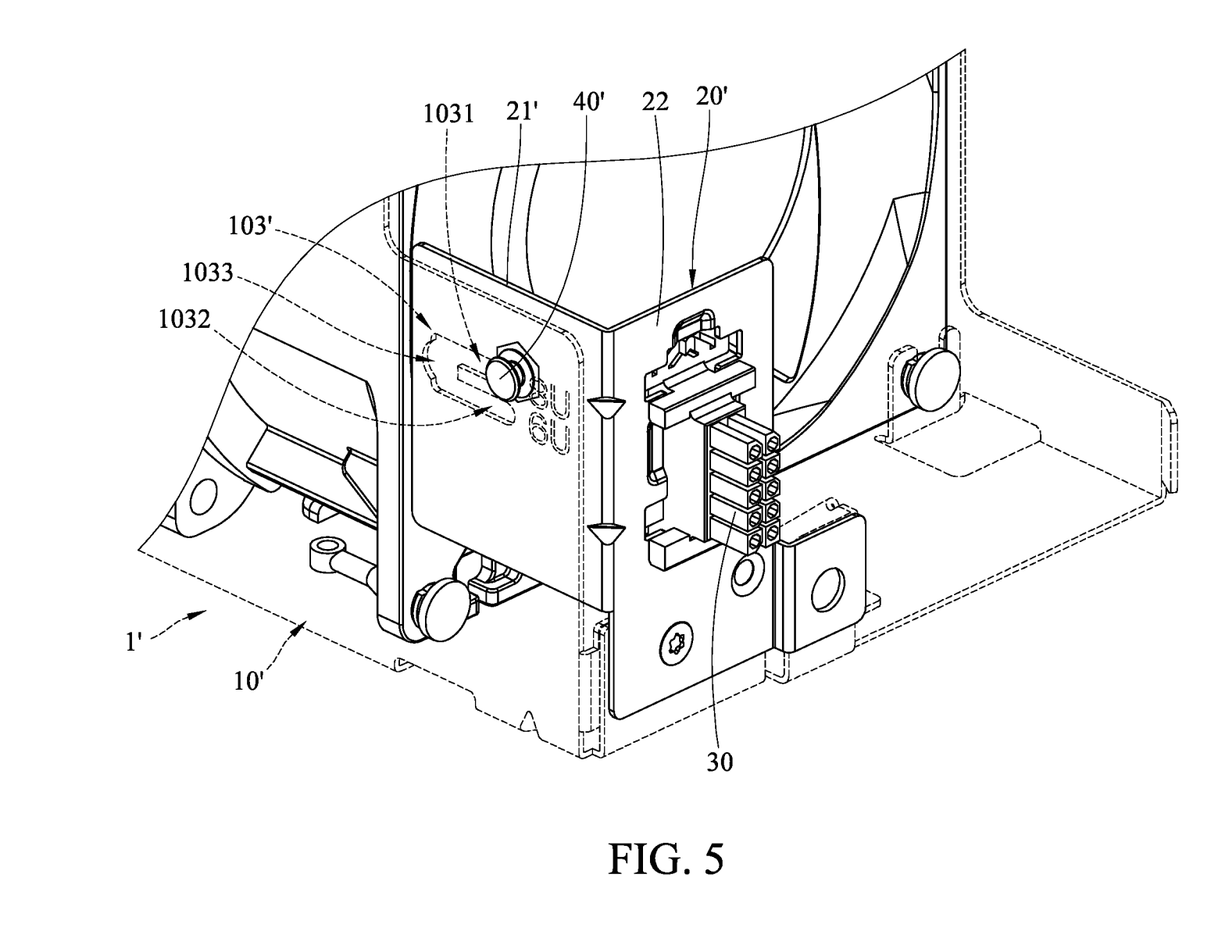
FIG. 5 is a perspective view of a cage assembly according to another embodiment of the disclosure.
Figure 6:
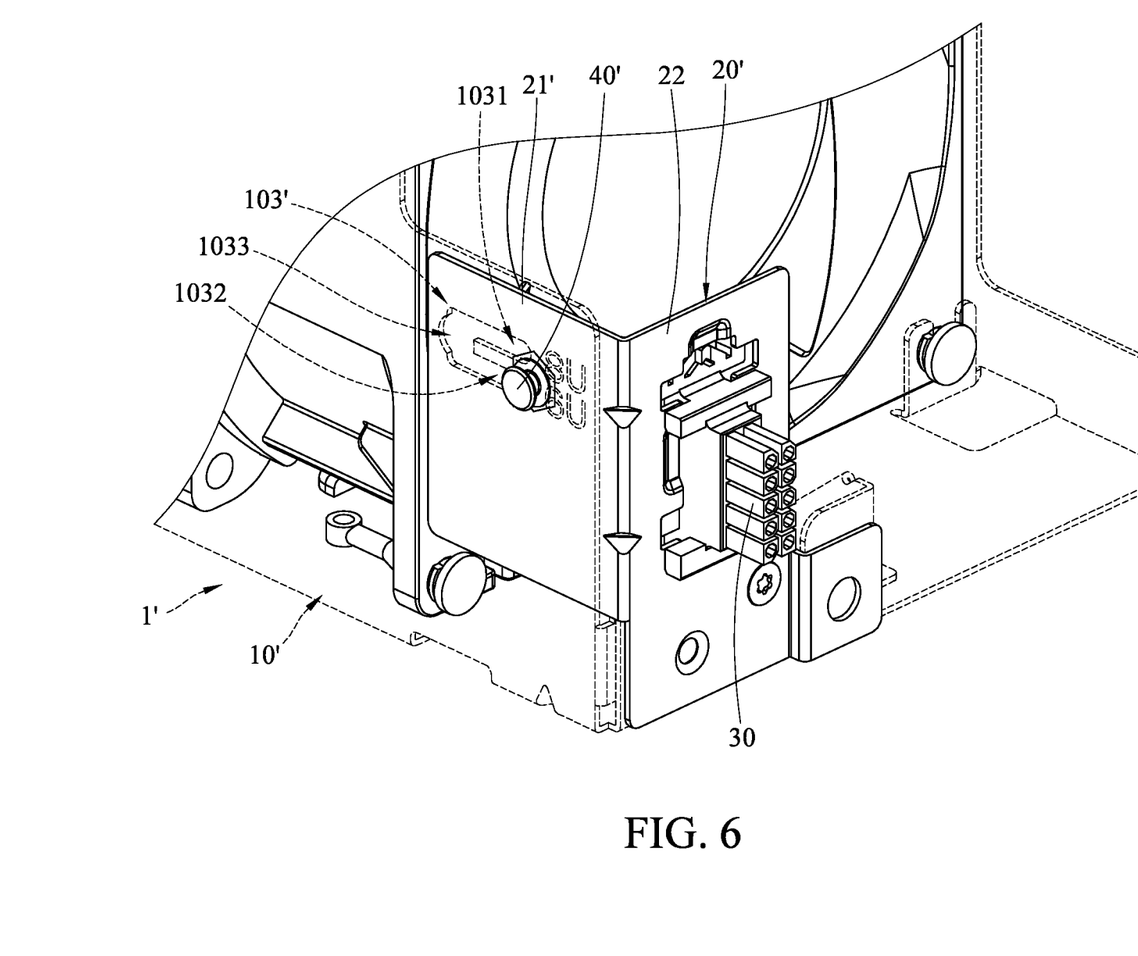
FIG. 6 depicts the operation of the cage assembly in FIG. 5.

Please see FIGS. 5-6, another embodiment of the disclosure provides a cage assembly 1' with a cage body 10' having a latching hole 103' in a U shape, where the latching hole 103' may include a first hole portion 1031, a second hole portion 1032, and a third hole portion 1033. The cage assembly 1' includes a latch 40' being slidably disposed through the latching hole 103' and fixed to a first plate portion 21' of an adjustable component 20'. In detail, the first hole portion 1031 and the second hole portion 1032 are spaced apart from each other and are substantially parallel to each other, the third hole portion 1033 is connected between the first hole portion 1031 and the second hole portion 1032. In specific, the third hole portion 1033 may be connected to the same side of the first hole portion 1031 and the second hole portion 1032. In other embodiments, the third hole portion 1033 may be located to the middle portion of the first hole portion 1031 and the second hole portion 1032 so that the first hole portion 1031, the second hole portion 1032, and the third hole portion 1033 together form a latching hole 103' in a I shape (not shown). The latch 40' may be a T-shaped structure protruding outwards from the first plate portion 21' of the adjustable component 20' and penetrating through the latching hole 103'. In other words, the latch 40' may be in T shape and movably along the latching hole 103'. For example, the latch 40' may be a bolt penetrating through and slidably along the latching hole 103' of the cage body 10'. The latch 40' is selectively slidable along the first hole portion 1031, the second hole portion 1032, or the third hole portion 1033. In such an arrangement, in FIG. 5, when the adjustable component 20' is switched to the first position to make the latch 40' reach the first hole portion 1031, the adjustable component 20' can be secured in the first position since the edge of the first hole portion 1031 restricts the latch 40'; on the other hand, in FIG. 6, when the adjustable component 20' is switched to the second position to make the latch 40' reach the second hole portion 1032, the adjustable component 20' can be secured in the second position since the edge of the second hole portion 1032 restricts the latch 40'.

Figure 7:
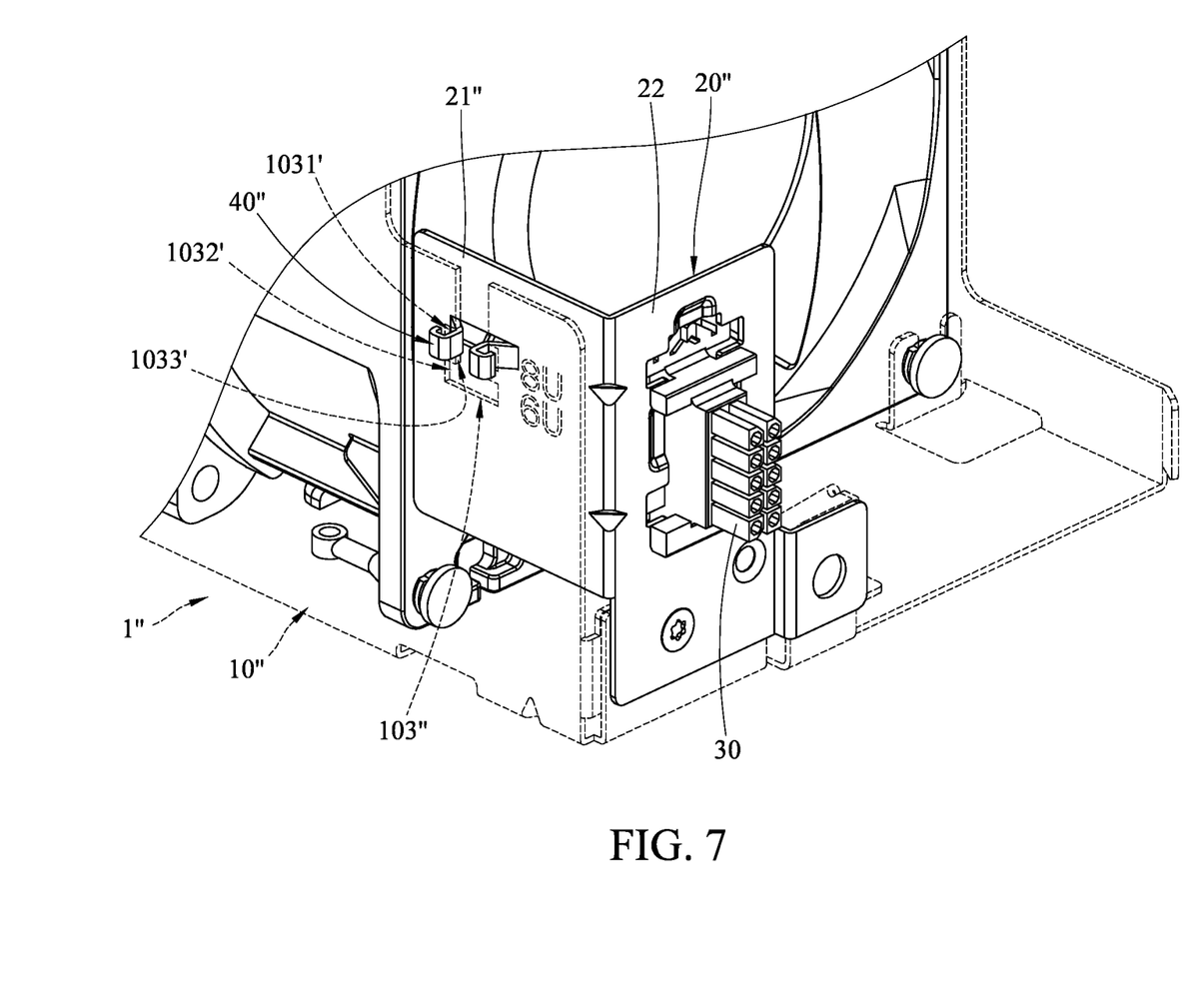
FIG. 7 is a perspective view of a cage assembly according to another embodiment of the disclosure.
Figure 8:
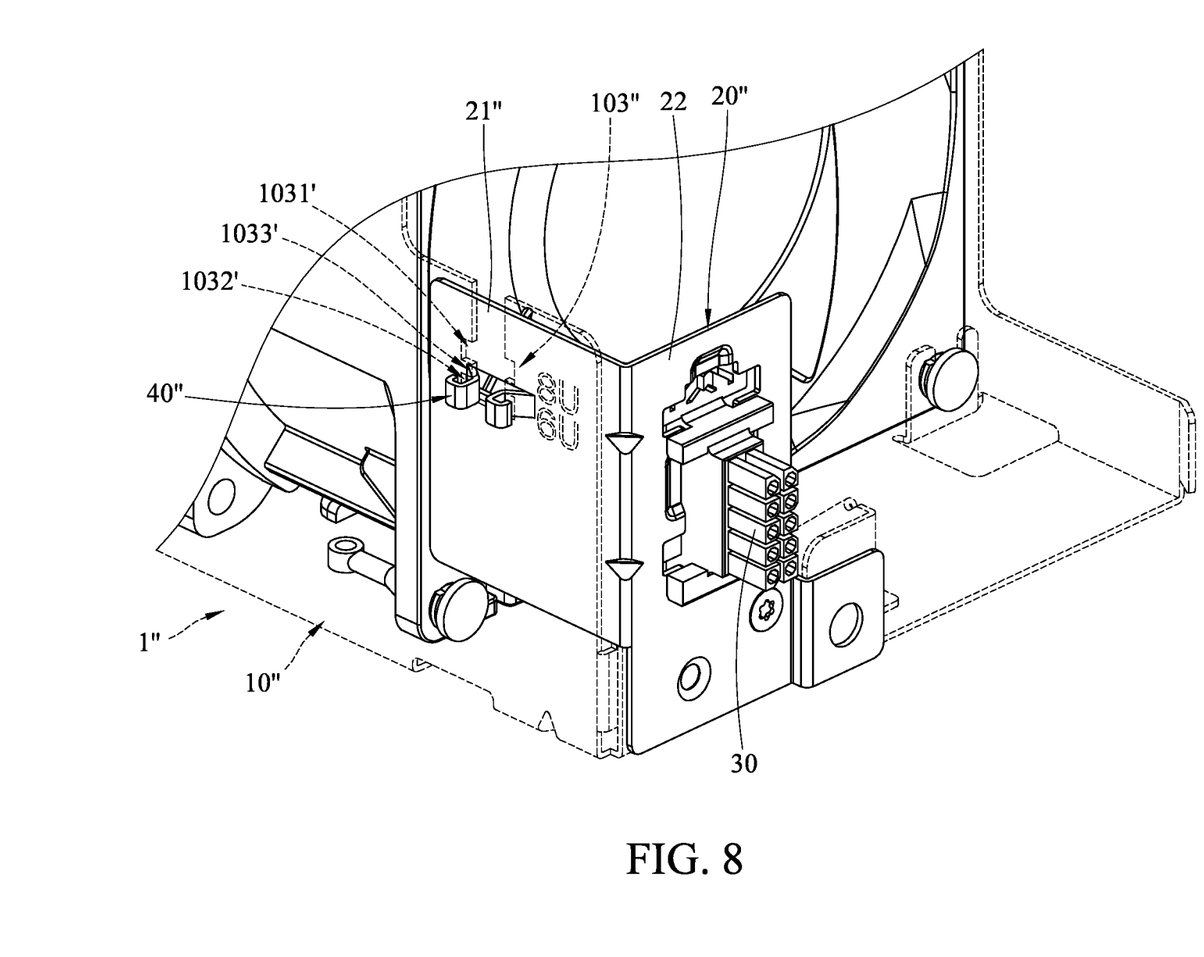
FIG. 8 depicts the operation of the cage assembly in FIG. 7.

Please see FIGS. 7-8, another embodiment of the disclosure provides a cage assembly 1" with a cage body 10" having a latching hole 103", where the latching hole 103" may include a first hole portion 1031', a second hole portion 1032', and a third hole portion 1033' connected to each other. The cage body 10" may include a latch 40" being elastic and integrally formed with a first plate portion 21" of an adjustable component 20". The latch 40" movably penetrates through the latching hole 103". In detail, the first hole portion 1031' and the second hole portion 1032' may be spaced apart from each other by the third hole portion 1033', and the first hole portion 1031', the third hole portion 1033', and the second hole portion 1032' may be arranged along a straight line. The third hole portion 1033' is narrower than that of the first hole portion 1031' and the second hole portion 1032'. In specific, the third hole portion 1033' may be horizontally narrower than the first hole portion 1031' and the second hole portion 1032'. Thus, the latch 40" is able to be engaged with the cage body 10" when it is at the first hole portion 1031' or the second hole portion 1032'; the latch 40" can slide across the third hole portion 1033' when being deformed and moved by fingers. In such an arrangement, in FIG. 7, when the adjustable component 20" is switched to the first position to make the latch 40" reach the first hole portion 1031', the adjustable component 20" can be secured in the first position since the latch 40' is engaged with the edge of the first hole portion 1031'; on the other hand, in FIG. 8, when the adjustable component 20" is switched to the second position by moving the latch 40", the latch 40" reaches the second hole portion 1032' and is engaged with the edge of the second hole portion 1032' so as to secure the adjustable component 20" in the second position. Note that the latch 40", as shown in FIGS. 7-8, being a pair of elastic tabs integrally formed on the adjustable component 20" is exemplary but not limiting. Any structure that is slidable along the aforementioned hole portions and engaged with the hole portions to secure the adjustable component in the first position or the second position is applicable to the disclosure.

According to the cage assembly and the electronic device as discussed in the above embodiments of the disclosure, the adjustable component of the cage assembly is movable relative to the cage body to change the position of the connector-installing portion, which allows the connector-installing portion to match the position of an electrical connector that the cage assembly is attempted to connect.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:
1. A cage assembly, comprising:
    a cage body; and
    an adjustable component movably disposed on the cage body and selectively fixed at one of a first position and a second position;

wherein the adjustable component has a connector-installing portion, and a position of the connector-installing portion is changed along with the adjustable component.

2. The cage assembly according to claim 1, wherein the adjustable component comprises a first plate portion and a second plate portion connected to each other, the first plate portion is at an angle to the second plate portion, the connector-installing portion is disposed on the second plate portion, and the connector-installing portion and the first plate portion are respectively located at different sides of the cage body.

3. The cage assembly according to claim 2, wherein the cage body has a first through hole, the second plate portion of the adjustable component has a second through hole; when the adjustable component is in the first position, the second through hole is aligned with the first through hole, a positioning post of a chassis penetrates through the second through hole and the first through hole; when the adjustable component is in the second position, the second through hole is not aligned with the first through hole.

4. The cage assembly according to claim 2, wherein the cage body has a slot, a tab protrudes from the first plate portion f the adjustable component, and the tab is slidably located in the slot and exposed by the slot.

5. The cage assembly according claim 2, further comprising a latch, wherein the latch comprises two elastic arm portions and a convex portion connected between the two elastic arm portions, the convex portion is movably disposed on the cage body via the two elastic arm portions and is movably located at a latching hole of the cage body, the first plate portion of the adjustable component has two accommodating holes and a push portion connected between the two accommodating holes; when the adjustable component is in the first position, the push portion pushes one of the two elastic arm portions and the convex portion penetrates through the latching hole and sticks out of an outer surface of the cage body; when the adjustable component is in the second position, the push portion is located at the convex portion, the two elastic arm portions are respectively partially located in the two accommodating holes and the convex portion is submerged in the latching hole.

6. The cage assembly according to claim 3, further comprising a latch, wherein the cage body has a latching hole, the latching hole comprises a first hole portion, a second hole portion, and a third hole portion connected between the first hole portion and the second hole portion, the latch is slidably disposed through the first hole portion, the second hole portion, or the third hole portion and is disposed on the first plate portion of the adjustable component; when the adjustable component is in the first position, the latch is located at the first hole portion; when the adjustable component is in the second position, the latch is located at the second hole portion.

7. The cage assembly according to claim 6, wherein the first hole portion and the second hole portion are spaced apart from each other and parallel to each other, the third hole portion is connected to the same side of the first hole portion and the second hole portion.

8. The cage assembly according to claim 7, wherein the latch is in T shape and protrudes from the first plate portion of the adjustable component.

9. The cage assembly according to claim 6, wherein the first hole portion and the second hole portion are spaced apart by the third hole portion, the first hole portion, the third hole portion, and the second hole portion are arranged in a straight line, and the third hole portion is horizontally narrower than the first hole portion and the second hole portion.

10. The cage assembly according to claim 9, wherein the latch is elastic and integrally formed with the first plate portion of the adjustable component.

11. An electronic device comprising:
a chassis; and
a cage assembly disposed on the chassis and comprising:
a cage body; and
an adjustable component movably disposed on the cage body and selectively fixed at one of a first position and a second position;
wherein the adjustable component has a connector-installing portion, and a position of the connector-installing portion is changed along with the adjustable component.

12. The electronic device according to claim 11, wherein the adjustable component comprises a first plate portion and a second plate portion connected to each other, the first plate portion is at an angle to the second plate portion, the connector-installing portion is disposed on the second plate portion, and the connector-installing portion and the first plate portion are respectively located at different sides of the cage body.

13. The electronic device according to claim 12, wherein the cage body has a first through hole, the second plate portion of the adjustable component has a second through hole; when the adjustable component is in the first position, the second through hole is aligned with the first through hole, a positioning post of the chassis penetrates through the second through hole and the first through hole; when the adjustable component is in the second position, the second through hole is not aligned with the first through hole.

14. The electronic device according to claim 12, wherein the cage body has a slot, a tab protrudes from the first plate portion of the adjustable component, and the tab is slidably located in the slot and exposed by the slot.

15. The electronic device according to claim 12, wherein the cage assembly further comprises a latch, the latch comprises two elastic arm portions and a convex portion connected between the two elastic arm portions, the convex portion is movably disposed on the cage body via the two elastic arm portions and is movably located at a latching hole of the cage body, the first plate portion of the adjustable component has two accommodating holes and a push portion connected between the two accommodating holes; when the adjustable component is in a first position, the push portion pushes one of the two elastic arm portions and the convex portion penetrates through the latching hole and sticks out of an outer surface of the cage body; when the adjustable component is in the second position, the push portion is located at the convex portion, the two elastic arm portions are respectively partially located in the two accommodating holes and the convex portion is submerged in the latching hole.

16. The electronic device according to claim 13, wherein the cage assembly further comprises a latch, the cage body has a latching hole, the latching hole comprises a first hole portion, a second hole portion, and a third hole portion connected between the first hole portion and the second hole portion, the latch is slidably disposed through the first hole portion, the second hole portion, or the third hole portion and is disposed on the first plate portion of the adjustable component; when the adjustable component is in the first position, the latch is located at the first hole portion; when the adjustable component is in the second position, the latch is located at the second hole portion.

17. The electronic device according to claim 16, wherein the first hole portion and the second hole portion are spaced apart from each other and parallel to each other, the third hole portion is connected to the same side of the first hole portion and the second hole portion, the latch is in T shape and protrudes from the first plate portion of the adjustable component.

18. The electronic device according to claim 16, wherein the first hole portion and the second hole portion are spaced apart by the third hole portion, the first hole portion, the third hole portion, and the second hole portion are arranged in a straight line, and the third hole portion is horizontally narrower than the first hole portion and the second hole portion.

19. The electronic device according to claim 18, wherein the latch is elastic and integrally formed with the first plate portion of the adjustable component.

20. An electronic device, adapted to accommodate an electrical component, comprising:
   a chassis;
   a circuit board disposed on the chassis; and
   a cage assembly comprising:
   a cage body removably accommodated in the chassis and configured to accommodate the electrical component; and
   an adjustable component movably disposed on the cage body and selectively fixed at one of a first position and a second position;
   wherein the adjustable component has a connector-installing portion, and a position of the connector-installing portion is changed along with the adjustable component switched between the first position and the second position;
   wherein the circuit board has a positioning post selectively fitting to the adjustable component when the adjustable component is in the first position.

* * * * *